US012628392B2

(12) United States Patent
Saito

(10) Patent No.: US 12,628,392 B2
(45) Date of Patent: May 12, 2026

(54) SWITCHING ELEMENT

(71) Applicants:DENSO CORPORATION, Kariya-city (JP); TOYOTA JIDOSHA KABUSHIKI KAISHA, Toyota (JP); MIRISE Technologies Corporation, Nisshin (JP)

(72) Inventor: Jun Saito, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 436 days.

(21) Appl. No.: 18/475,577

(22) Filed: Sep. 27, 2023

(65) Prior Publication Data

US 2025/0107187 A1 Mar. 27, 2025

(30) Foreign Application Priority Data

Oct. 6, 2022 (JP) ................................. 2022-161714

(51) Int. Cl.
H10D 62/13 (2025.01)
H10D 30/66 (2025.01)
(Continued)

(52) U.S. Cl.
CPC ......... H10D 62/155 (2025.01); H10D 30/668 (2025.01); H10D 62/127 (2025.01); H10D 62/154 (2025.01); H10D 64/513 (2025.01)

(58) Field of Classification Search
CPC .. H10D 62/155; H10D 30/668; H10D 62/127; H10D 62/154; H10D 64/513; H10D 62/393; H10D 64/519; H10D 62/235
See application file for complete search history.

(56) References Cited

U.S. PATENT DOCUMENTS

| | | | |
|---|---|---|---|
| 2002/0043684 A1 | 4/2002 | Kubo | |
| 2007/0040213 A1* | 2/2007 | Hotta | H10D 10/00 |
| | | | 257/E29.066 |

(Continued)

FOREIGN PATENT DOCUMENTS

GB 2572442 A 10/2019

OTHER PUBLICATIONS

T.Kato et al., "Enhanced performance of 50nm Ultra-Narrow-Body Silicon Carbide MOSFETs based on FinFET effect", ISPSD 2020, Proceedings of the 2020 32nd International Symposium on Power Semiconductor Devices and ICs (ISPSD), Sep. 13-18, 2020, Vienna, Austria, pp. 110-113.

*Primary Examiner* — Herve-Louis Y Assouman

(74) *Attorney, Agent, or Firm* — Posz Law Group, PLC

(57) ABSTRACT

A switching element includes a gate electrode and a source electrode disposed in each of trenches provided in a semiconductor substrate. A longitudinal direction of the trench is defined as a first direction, and the trenches are spaced from each other in a second direction intersecting the first direction. Each of the trenches extends in the first direction while being displaced in the second direction so as to satisfy that an inter-trench region between the adjacent trenches has narrow portions and wide portions alternately arranged in the first direction and alternately arranged in the second direction via the trenches. A source region is distributed across the narrow portion and the wide portion, and is in contact with the source electrode in the wide portion.

8 Claims, 12 Drawing Sheets

(51) Int. Cl.
*H10D 62/10* (2025.01)
*H10D 62/17* (2025.01)
*H10D 64/27* (2025.01)

(56) References Cited

U.S. PATENT DOCUMENTS

2009/0072304 A1    3/2009  Adan
2017/0092742 A1    3/2017  Onishi et al.
2018/0122926 A1    5/2018  Menta et al.

* cited by examiner

FIG. 3

SWITCHING ELEMENT

CROSS REFERENCE TO RELATED APPLICATION

This application is based on Japanese Patent Application No. 2022-161714 filed on Oct. 6, 2022, the disclosure of which is incorporated herein by reference.

TECHNICAL FIELD

The present disclosure relates to a switching element.

BACKGROUND

A switching element has trenches, and an interval is defined between the trenches. A gate electrode and a gate insulating film are disposed in each of the trenches. An n-type source region and a p-type body region are provided between the trenches. The source region is in contact with the gate insulating film at an upper end of each trench. The source region is in contact with a source electrode provided on the surface of the semiconductor substrate. The body region is in contact with the gate insulating film on the lower side of the source region. An n-type drift region is provided below the body region.

SUMMARY

A switching element includes: a semiconductor substrate; trenches provided on an upper surface of the semiconductor substrate; a gate insulating film covering an inner surface of each of the trenches; a gate electrode disposed in each of the trenches and insulated from the semiconductor substrate by the gate insulating film; and a source electrode provided on the upper surface of the semiconductor substrate. The trenches are arranged on the upper surface such that a longitudinal direction of each of the trenches is a first direction. The trenches are arranged on the upper surface and spaced from each other in a second direction intersecting the first direction. Each of the trenches extends in the first direction while being displaced in the second direction on the upper surface so as to meet a first condition that each inter-trench region which is a semiconductor region defined between the trenches adjacent to each other has narrow portions and wide portions wider in the second direction than the narrow portions, and a second condition that the narrow portions and the wide portions are alternately arranged along the first direction, on the upper surface, and the narrow portions and the wide portions are alternately arranged along the second direction via the trenches. The semiconductor substrate includes: an n-type source region disposed in each of the inter-trench regions over the narrow portion and the wide portion, in contact with the source electrode in the wide portion, and in contact with the gate insulating film in the narrow portion; a p-type body region disposed in each of the inter-trench regions and in contact with the gate insulating film on a lower side of the source region in the narrow portion; and an n-type drift region distributed from inside of each narrow portion to a region below the trenches and is in contact with the gate insulating film on the lower side of the body region in the narrow portion.

BRIEF DESCRIPTION OF DRAWINGS

FIG. 3 is a cross-sectional view illustrating the switching element according to the first embodiment taken along the y direction.

DETAILED DESCRIPTION

A switching element has trenches arranged at intervals. A gate electrode and a gate insulating film are disposed in each of the trenches. An n-type source region and a p-type body region are provided between the trenches. The source region is in contact with the gate insulating film at an upper end of each trench. The source region is in contact with a source electrode provided on the surface of the semiconductor substrate. The body region is in contact with the gate insulating film on the lower side of the source region. An n-type drift region is provided below the body region. By applying a predetermined potential to each gate electrode, a channel is formed in the vicinity of the trench in the body region. That is, channels are formed on both side surfaces of the body region. The source region and the drift region are connected by the channel, and the switching element is turned on. Channels generated on both side surfaces of the body region are coupled by narrowing an interval between the trenches (that is, a width of the body region between the trenches). When the two channels are coupled, the concentration of electron in the channel increases, and the mobility of the channel increases. Hereinafter, an increase in the mobility of the channel by narrowing the interval between the trenches is referred to as a narrow channel effect.

It is possible to increase the mobility of the channel by narrowing the interval between the trenches. However, when the interval between the trenches is narrowed, the area in which the source region disposed between the trenches is in contact with the source electrode is reduced. Therefore, the contact resistance of the source region with respect to the source electrode increases. As described above, when the interval between the trenches is simply narrowed, while the mobility of the channel increases, the contact resistance of the source region increases, such that the loss generated in the switching element cannot be reduced so much.

Figure 12:
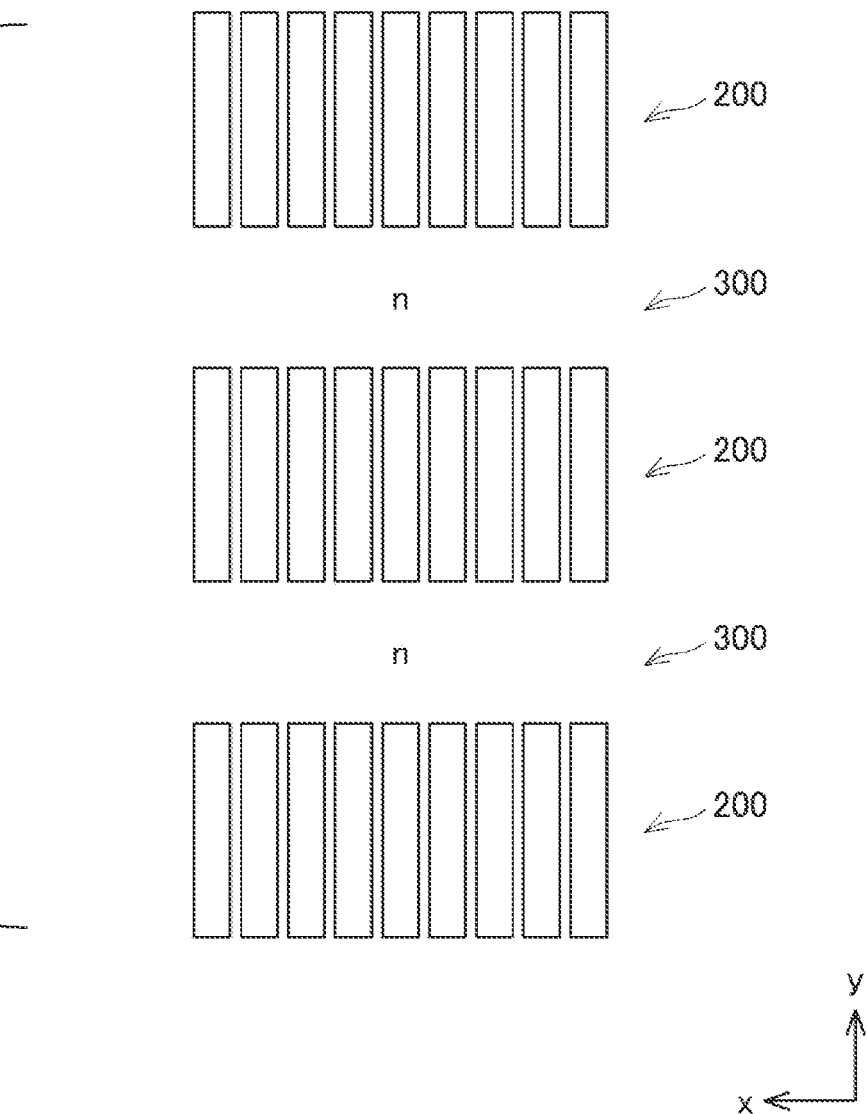
FIG. 12 is a plan view illustrating arrangement of trenches in a comparative example.

FIG. 12 shows an arrangement of trenches newly studied for reducing the contact resistance of the source region. In FIG. 12, gate trenches are arranged at narrow intervals within a region 200, and no gate trench is provided in a region 300 on the surface of the semiconductor substrate. In the region 200, the gate trenches are arranged at intervals in the x direction. The regions 200 and the regions 300 are alternately arranged in the y direction. The source region is distributed from a region between the gate trenches (that is, a region having a narrow width) to the region 300. The source region is in contact with the source electrode in the region 300 where the gate trench does not exist. In the structure of FIG. 12, when the switching element is turned on, electrons flow into the source region from the source electrode in the region 300. The electrons flowing into the source region in the region 300 flow to the region 200 (that is, the source region between the gate trenches) along the y direction, and flow to the channel in the region 200. In the region 300 having a large area, the source region is in contact with the source electrode with a low contact resistance. Further, in the region 200, high channel mobility is realized by the narrow channel effect. As described above, according to the structure of FIG. 12, it is possible to realize high channel mobility while reducing the contact resistance of the source region.

However, in the structure of FIG. 12, since a channel is not formed in the region 300, electrons after passing through the channel hardly flow in the region 300. That is, the density of current in the region 300 is low, and the current concentrates in the region 200. Therefore, the resistance increases due to the current concentration. In addition, a local temperature rise occurs due to the current concentration, which affects the durability of the switching element. The present specification proposes a technique for reducing the contact resistance in a source region and dispersing a current in a switching element in which a narrow channel effect is obtained.

A switching element includes: a semiconductor substrate; trenches provided on an upper surface of the semiconductor substrate; a gate insulating film covering an inner surface of each of the trenches; a gate electrode disposed in each of the trenches and insulated from the semiconductor substrate by the gate insulating film; and a source electrode provided on the upper surface of the semiconductor substrate. The trenches are arranged on the upper surface such that a longitudinal direction of each of the trenches is a first direction. The trenches are arranged on the upper surface and spaced from each other in a second direction intersecting the first direction. Each of the trenches extends in the first direction while being displaced in the second direction on the upper surface so as to meet a first condition that each inter-trench region which is a semiconductor region defined between the trenches adjacent to each other has narrow portions and wide portions wider in the second direction than the narrow portions, and a second condition that the narrow portions and the wide portions are alternately arranged along the first direction, on the upper surface, and the narrow portions and the wide portions are alternately arranged along the second direction via the trenches. The semiconductor substrate includes: an n-type source region disposed in each of the inter-trench regions over the narrow portion and the wide portion, in contact with the source electrode in the wide portion, and in contact with the gate insulating film in the narrow portion; a p-type body region disposed in each of the inter-trench regions and in contact with the gate insulating film on a lower side of the source region in the narrow portion; and an n-type drift region distributed from inside of each narrow portion to a region below the trenches and is in contact with the gate insulating film on the lower side of the body region in the narrow portion.

In this switching element, each inter-trench region has a narrow portion and a wide portion. In the narrow portion, high channel mobility can be realized due to the narrow channel effect in the body region. The source region is distributed from the narrow portion to the wide portion, and is in contact with the source electrode in the wide portion. Since the width of the wide portion is large, the source region is in contact with the source electrode with low contact resistance. As described above, according to this switching element, high channel mobility can be realized by the narrow channel effect, and the contact resistance of the source region can be reduced. The wide portion may have a structure in which current flows or a structure in which current does not flow. Even in case where the current flows in the wide portion, since the narrow channel effect is not obtained in the wide portion, the current flowing in the wide portion is much smaller than the current flowing in the narrow portion. In this switching element, the wide portion and the narrow portion are alternately arranged in the first direction and the second direction. Therefore, the narrow portions are arranged in a dispersed manner. Therefore, according to the structure of the switching element, a current can flow in a distributed manner in the semiconductor substrate.

In a switching element of the present specification, the body region may be distributed across the narrow portion and the wide portion, and may be disposed below the source region in the wide portion. The drift region may be distributed across a lower part of the wide portion and a lower part of the narrow portion.

In the switching element of the present specification, the semiconductor substrate may include a p-type electric field relaxation region in contact with the body region and is in contact with the gate insulating film at a corner portion between a side surface of the trench adjacent to the wide portion and a bottom surface of the trench.

Accordingly, it is possible to restrict a high electric field from being applied to the gate insulating film at the corner portion of the trench.

In the switching element of the present specification, a width of the inter-trench region in the second direction may gradually decrease from the wide portion toward the narrow portion at each boundary portion between the narrow portion and the wide portion.

Accordingly, it is possible to restrict a high electric field from being applied to the gate insulating film at each boundary portion.

In the switching element of the present specification, a connection trench that connects the trenches through the narrow portion may be provided on the upper surface of the semiconductor substrate.

Accordingly, it is possible to suppress breakage of the narrow portion in the process of manufacturing the switching element.

In the switching element of the present specification, in each of the narrow portions, a width of the narrow portion in the second direction may gradually decrease from the wide portion toward a central part of the narrow portion. In the central part of the narrow portion, the trenches located on both sides of the narrow portion may be connected to each other.

Accordingly, a higher narrow channel effect can be obtained.

In the switching element of the present specification, the source region may be in contact with the source electrode in each of the narrow portions.

Accordingly, the contact resistance of the source region can be further reduced.

In the switching element of the present specification, the body region may be in contact with the source electrode in each of the wide portions.

Accordingly, the contact resistance of the body region with respect to the source electrode can be reduced.

First Embodiment

Figure 1:
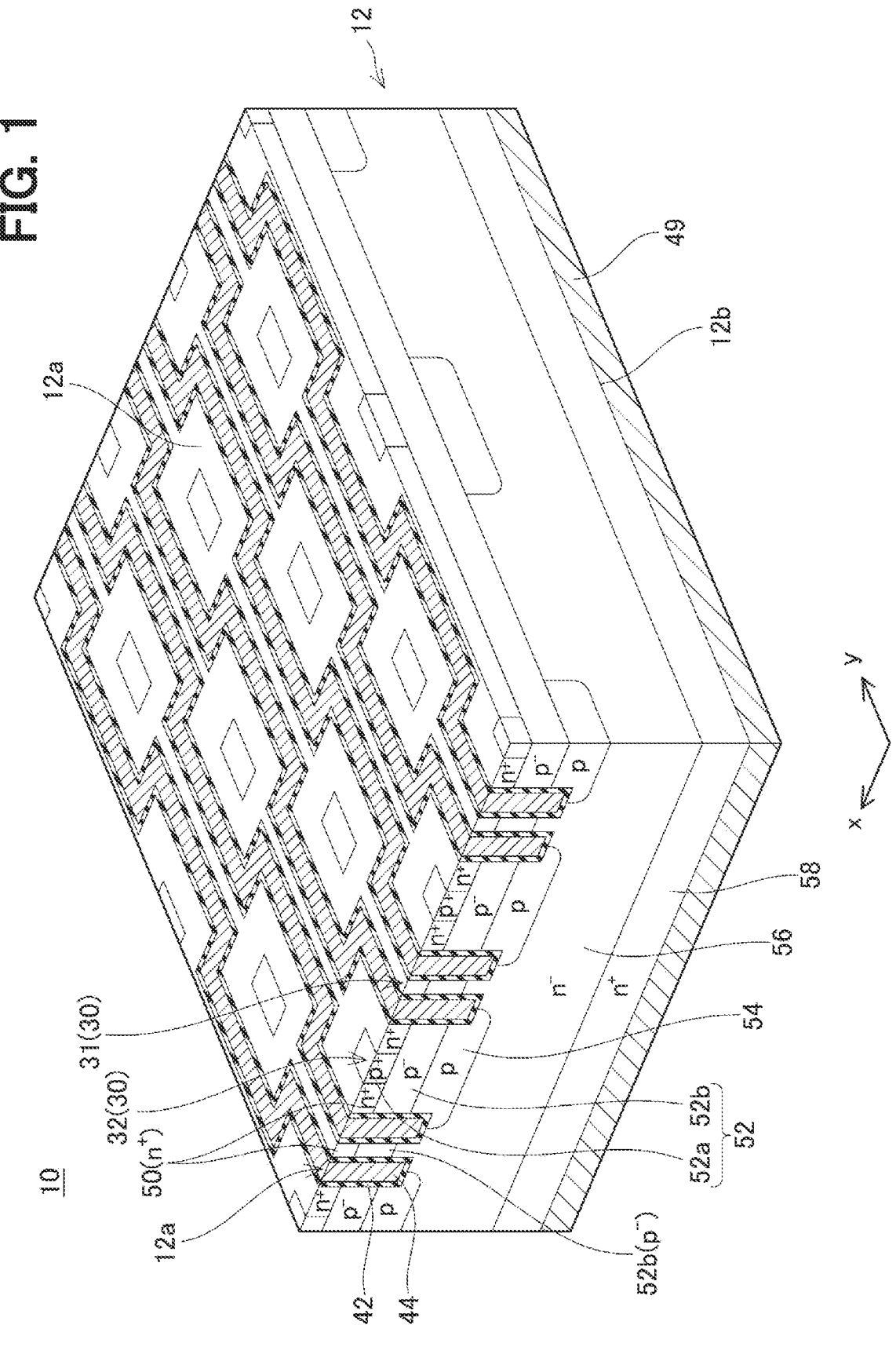
FIG. 1 is a perspective and cross-sectional view illustrating a switching element according to a first embodiment.
Figure 2:
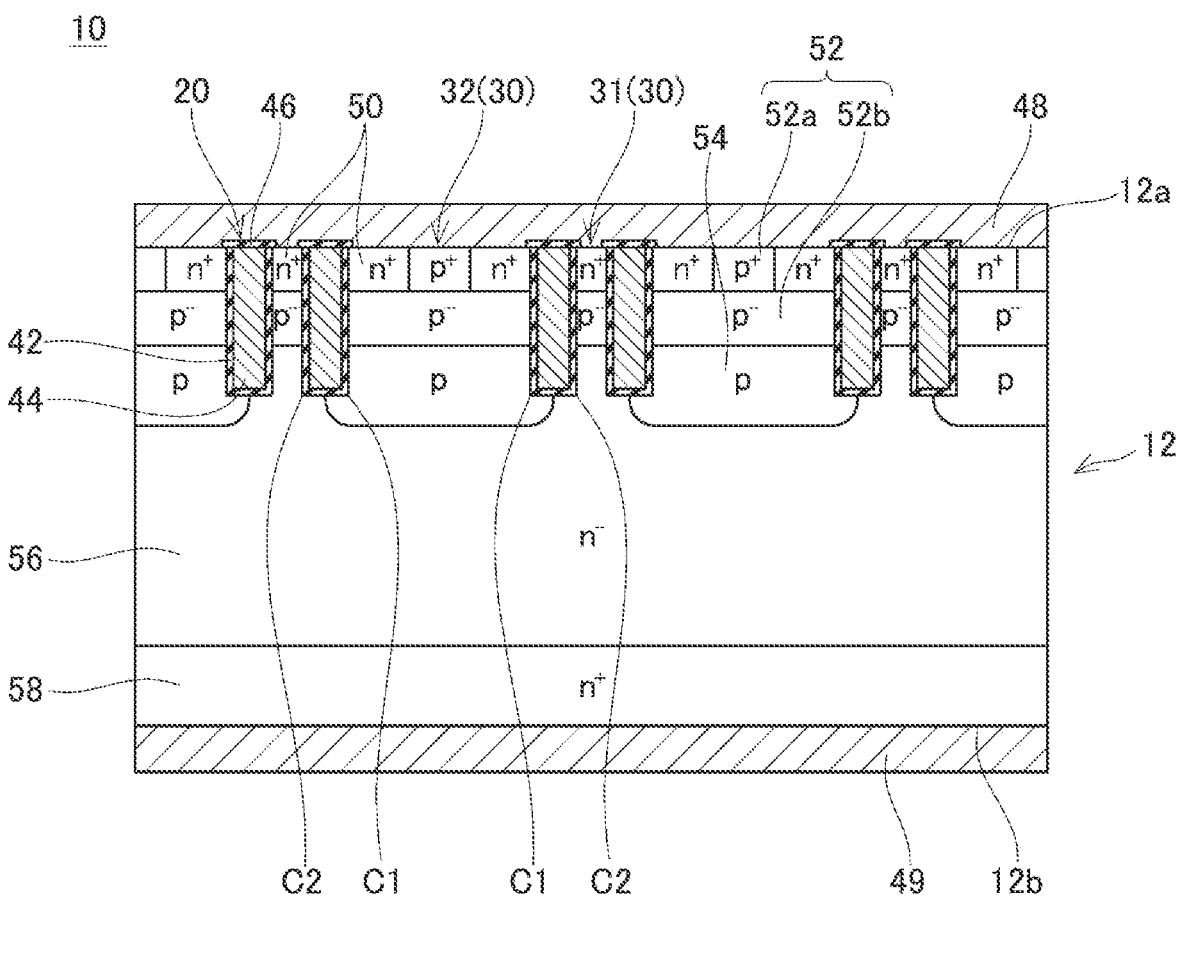
FIG. 2 is a cross-sectional view illustrating the switching element according to the first embodiment taken along the x direction.
Figure 3:
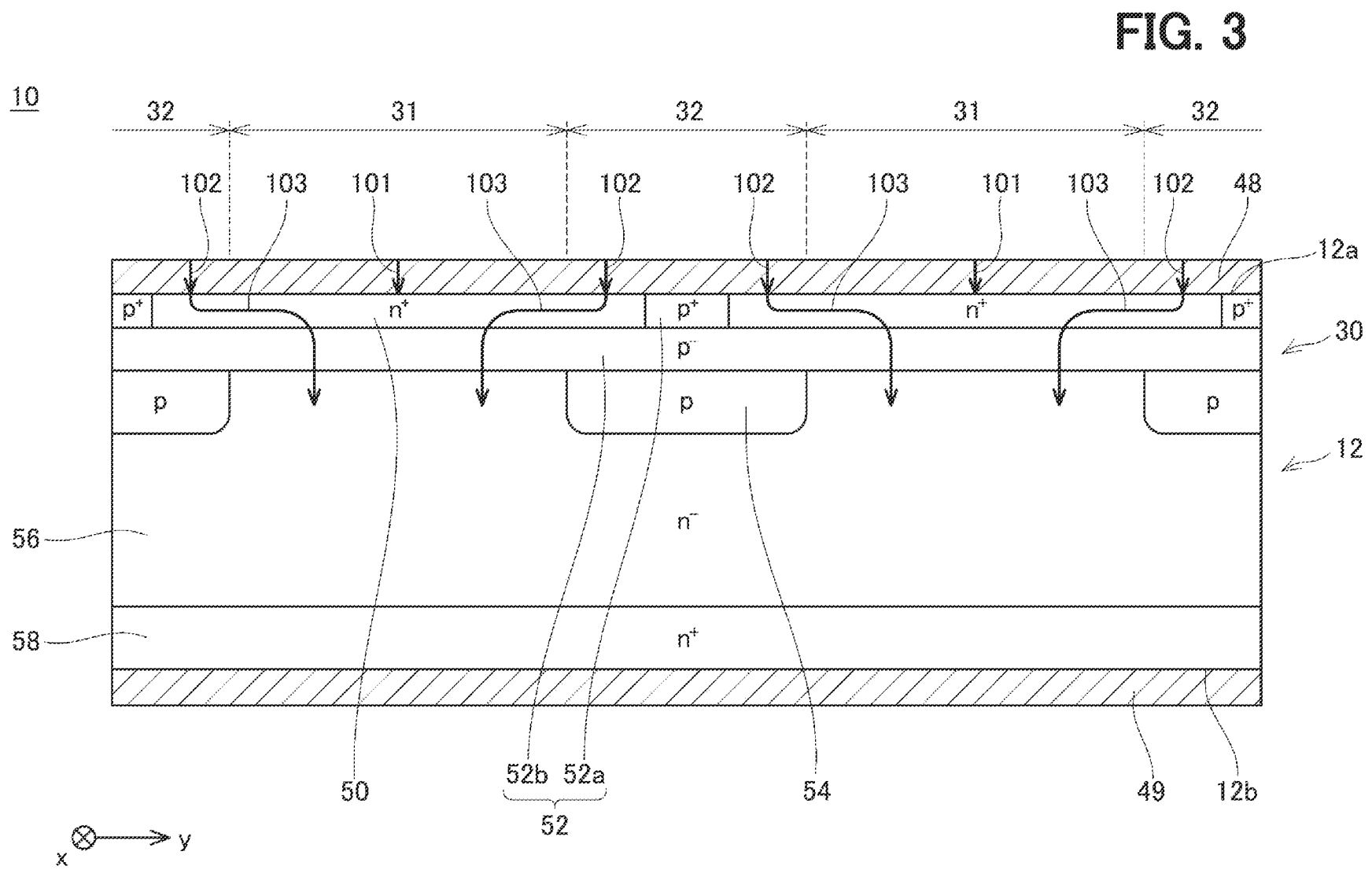

A switching element 10 of the first embodiment illustrated in FIGS. 1 to 3 includes a semiconductor substrate 12. The semiconductor substrate 12 is made of SiC. Note that the semiconductor substrate 12 may be made of another semiconductor material such as Si or GaN. Hereinafter, a direction parallel to the upper surface 12a of the semiconductor substrate 12 is referred to as an x direction, and a direction parallel to the upper surface 12a and orthogonal to the x direction is referred to as a y direction.

Figure 4:
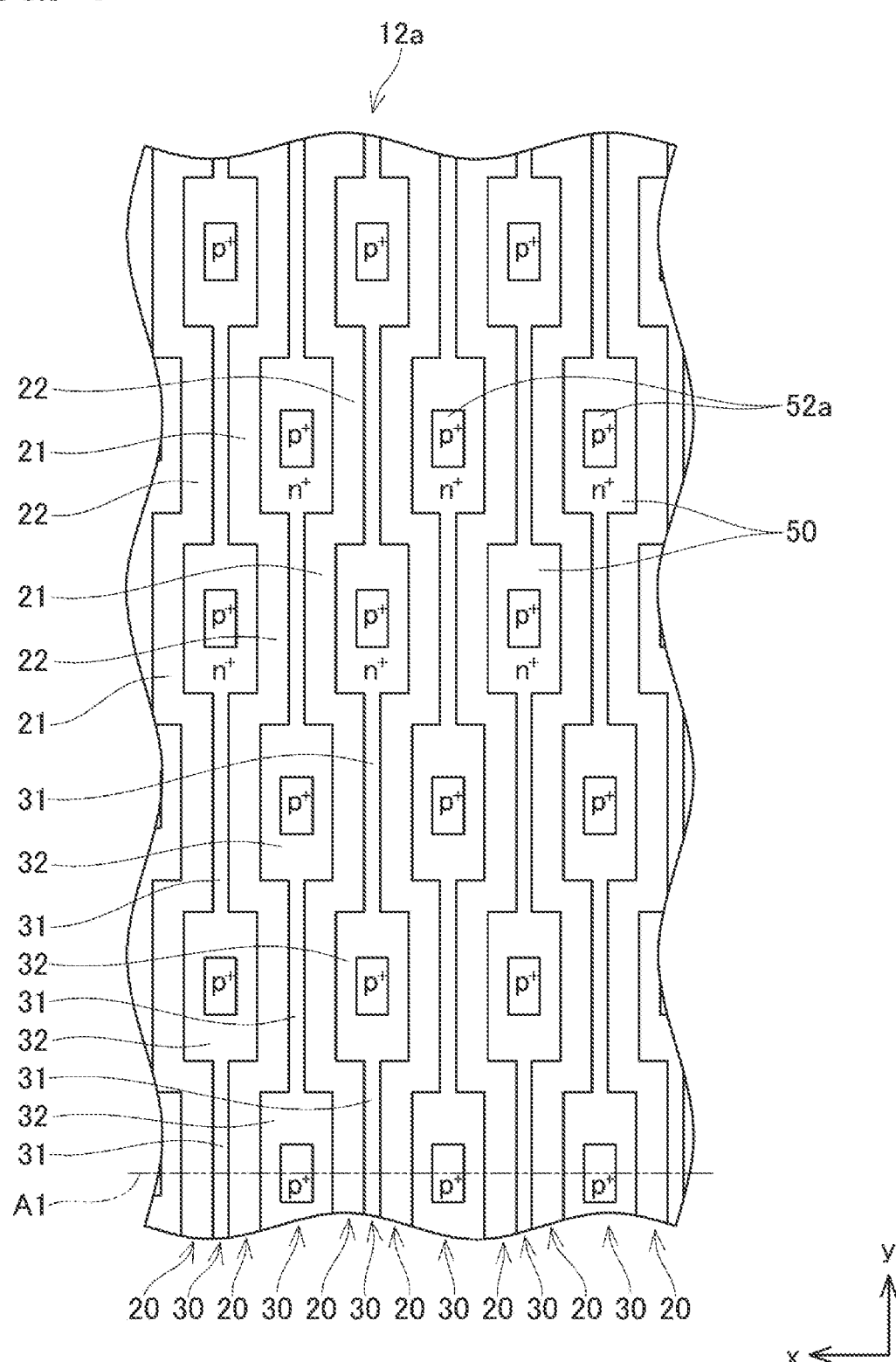
FIG. 4 is a plan view showing arrangement of trenches on the upper surface of the switching element according to the first embodiment.

As shown in FIGS. 1 and 2, multiple trenches 20 are defined on the upper surface 12a of the semiconductor substrate 12. FIG. 4 shows the arrangement of the trenches 20 on the upper surface 12a. Each trench 20 is disposed on the upper surface 12a such that the longitudinal direction of each trench 20 is along the y direction. Each trench 20 extends in the y direction while being bent so as to reciprocate in the x direction. That is, each trench 20 extends in the y direction while alternately displaced in the x direction and in the −x direction. Therefore, each trench 20 has a first portion 21 displaced in the x direction from its own center line and a second portion 22 displaced in the −x direction from its own center line. In each trench 20, the first portion 21 and the second portion 22 are alternately arranged along the y direction. The trenches 20 are arranged to be spaced away from each other at intervals in the x direction. Each trench 20 is arranged such that the second portion 22 of the adjacent trench 20 is located in the x direction and the −x direction when viewed from the first portion 21 thereof, and the first portion 21 of the adjacent trench 20 is arranged in the x direction and the −x direction when viewed from the second portion 22 thereof. A semiconductor region (hereinafter, referred to as an inter-trench region 30) is defined between the adjacent trenches 20. Each of the inter-trench regions 30 includes a narrow portion 31 and a wide portion 32. The width of the wide portion 32 in the x direction is wider than the width of the narrow portion 31 in the x direction. The narrow portion 31 is located between the second portion 22 present in the x direction and the first portion 21 present in the −x direction. The wide portion 32 is located between the first portion 21 present in the x direction and the second portion 22 present in the −x direction. On the upper surface 12a, the narrow portions 31 and the wide portions 32 are alternately arranged along the y direction. That is, in each inter-trench region 30, the narrow portions 31 and the wide portions 32 are alternately arranged along the y direction. On the upper surface 12a, the narrow portions 31 and the wide portions 32 are alternately arranged along the x direction via the trenches 20. That is, at any position of the wide portion 32, when viewed along a straight line extending in the x direction across the wide portion 32 (such as imaginary line A1 of FIG. 4), the narrow portion 31 and the wide portion 32 are alternately arranged via the trench 20.

As shown in FIGS. 1 and 2, a gate insulating film 42 and a gate electrode 44 are disposed in each of the trenches 20. In FIG. 4, illustration of the gate insulating film 42 and the gate electrode 44 in each trench 20 is omitted. The gate insulating film 42 covers an inner surface of the trench 20. The gate electrode 44 is insulated from the semiconductor substrate 12 by the gate insulating film 42.

As shown in FIGS. 2 and 3, an interlayer insulating film 46 and a source electrode 48 are provided on the semiconductor substrate 12. In FIG. 1, illustration of the interlayer insulating film 46 and the source electrode 48 is omitted. The interlayer insulating film 46 covers the upper surface of the gate electrode 44. The source electrode 48 covers the interlayer insulating film 46 and the upper surface 12a of the semiconductor substrate 12. The source electrode 48 is in contact with the upper surface 12a of the semiconductor substrate 12 within a range in which the interlayer insulating film 46 does not exist. Each gate electrode 44 is insulated from the source electrode 48 by the interlayer insulating film 46 on the upper portion thereof.

As shown in FIGS. 1 to 3, the drain electrode 49 is provided under the semiconductor substrate 12. The drain electrode 49 is in contact with the lower surface 12b of the semiconductor substrate 12.

As illustrated in FIGS. 1 to 3, the semiconductor substrate 12 includes a source region 50, a body region 52, an electric field relaxation region 54, a drift region 56, and a drain region 58.

As shown in FIG. 1, the source region 50 is an n-type region and is disposed in each inter-trench region 30. The source region 50 is provided in a surface layer portion of the semiconductor substrate 12 in the vicinity of the upper surface 12a. As shown in FIG. 3, the source region 50 is distributed over the narrow portion 31 and the wide portion 32. As shown in FIGS. 2 and 3, the source region 50 is in ohmic contact with the source electrode 48 in the narrow portion 31 and the wide portion 32. As shown in FIGS. 1 and 2, the source region 50 is in contact with the gate insulating film 42 in the narrow portion 31 and the wide portion 32.

As shown in FIG. 1, the body region 52 is a p-type region and is disposed in each inter-trench region 30. As shown in FIG. 3, the body region 52 is distributed over the narrow portion 31 and the wide portion 32. The body region 52 includes a contact region 52a and a low concentration region 52b. The p-type impurity concentration of the contact region 52a is higher than the p-type impurity concentration of the low concentration region 52b. As shown in FIGS. 1 to 3, the contact region 52a is provided in the surface layer portion of the semiconductor substrate 12 in the vicinity of the upper surface 12a in the wide portion 32. The contact region 52a is in ohmic contact with the source electrode 48 in the wide portion 32. The low concentration region 52b is distributed over the narrow portion 31 and the wide portion 32. The low concentration region 52b is in contact with the contact region 52a and the source region 50 from the lower side. The low concentration region 52b is in contact with the gate insulating film 42 below the source region 50 in the narrow portion 31 and the wide portion 32.

The electric field relaxation region 54 is a p-type region having a higher p-type impurity concentration than the low concentration region 52b. As shown in FIGS. 1 and 2, electric field relaxation regions 54 are distributed from the inside of each wide portion 32 to the lower portion of the trench 20 on both sides thereof. As shown in FIGS. 1 to 3, the electric field relaxation region 54 does not exist in the narrow portion 31 and the lower portion thereof. The electric field relaxation region 54 is in contact with the low concentration region 52b in the wide portion 32 from the lower side. The electric field relaxation region 54 is in contact with the gate insulating film 42 on the lower side of the low concentration region 52b in the wide portion 32. More specifically, the electric field relaxation region 54 is in contact with the gate insulating film 42 within a range extending across the side surface of the trench 20 and the bottom surface of the trench 20 in the wide portion 32. Therefore, as shown in FIG. 2, the electric field relaxation region 54 is in contact with the gate insulating film 42 at the corner portion C1 between the side surface of the trench 20 adjacent to the wide portion 32 and the bottom surface of the trench 20. The electric field relaxation region 54 is not in contact with the corner portion C2 between the side surface of the trench 20 adjacent to the narrow portion 31 and the bottom surface of the trench 20.

The drift region 56 is an n-type region having an n-type impurity concentration lower than that of the source region 50. As illustrated in FIGS. 1 to 3, the drift region 56 is distributed within a region below the trenches 20 (more specifically, a range extending over the lower portion of each trench 20, the lower portion of each narrow portion 31, and the lower portion of each wide portion 32). The drift region 56 is also distributed in each narrow portion 31. That is, the drift region 56 is distributed from the inside of each narrow portion 31 to a region on the lower side of the trenches 20. The drift region 56 is in contact with the low concentration region 52b in the narrow portion 31 from the lower side. The drift region 56 is in contact with the gate insulating film 42 on the lower side of the low concentration region 52b in the narrow portion 31. Therefore, the drift region 56 is in contact with the gate insulating film 42 at the corner portion C2. The drift region 56 is in contact with the side surface and the bottom surface of the electric field relaxation region 54.

The drain region 58 is an n-type region having a higher n-type impurity concentration than the drift region 56. As shown in FIGS. 1 to 3, the drain region 58 is in contact with the drift region 56 from the lower side. The drain region 58 is in ohmic contact with the drain electrode 49 on the lower surface 12b of the semiconductor substrate 12.

The following describes the operation of the switching element 10. The switching element 10 is a Metal-Oxide-Semiconductor Field-Effect Transistor (MOSFET). When the switching element 10 is used, a potential higher than that of the source electrode 48 is applied to the drain electrode 49. The potential of the gate electrode 44 is controlled independently of the drain electrode 49 and the source electrode 48. When a potential equal to or higher than the gate threshold is applied to the gate electrode 44, an inversion layer is formed in the low concentration region 52b in the vicinity of the gate insulating film 42. The source region 50 and the drift region 56 are connected by the inversion layer formed in the narrow portion 31. That is, the inversion layer formed in the narrow portion 31 functions as a channel. Although the inversion layer is also formed in the wide portion 32, since the electric field relaxation region 54 is provided below the low concentration region 52b (that is, the region where the inversion layer is formed) in the wide portion 32, the inversion layer formed in the wide portion 32 does not function as a channel. Since the width of the narrow portion 31 (that is, the interval between the trenches 20 through the narrow portion 31) is narrow, the channels formed along the gate insulating films 42 on both sides of the narrow portion 31 are coupled to each other. Therefore, the entire low concentration region 52b in the narrow portion 31 becomes a channel. In addition, the coupling of the channels in this manner causes a narrow channel effect, and the mobility of the channel in the narrow portion 31 is extremely high. For example, in SiC, when the width of the narrow portion 31 (that is, the interval between the trenches 20 in the narrow portion 31) is 300 nm or less, a narrow channel effect can be obtained. The narrower the width of the narrow portion 31, the higher the channel mobility. For example, when the width of the narrow portion 31 is 100 nm or less, the narrow channel effect can be efficiently obtained. When the source region 50 and the drift region 56 are connected by the channel formed in the narrow portion 31, electrons flow from the source electrode 48 to the drain electrode 49 via the source region 50, the channel, the drift region 56, and the drain region 58. Therefore, the switching element 10 is turned on. When the potential of the gate electrode 44 is lowered to a potential lower than the gate threshold, the channel disappears and the switching element 10 is turned off.

Arrows 101 to 103 in FIG. 3 indicates a path through which electrons flow when the switching element 10 is turned on. The source electrode 48 is in ohmic contact with the source region 50 in the narrow portion 31 and the wide portion 32. Accordingly, as indicated by the arrows 101 and 102 in FIG. 3, electrons flow from the source electrode 48 into the source region 50 in the narrow portion 31 and the wide portion 32. Since the width of the narrow portion 31 is narrow, the contact area of the source region 50 in the narrow portion 31 with the source electrode 48 is small. Therefore, the contact resistance of the source region 50 in the narrow portion 31 with respect to the source electrode 48 is extremely high. Therefore, the number of electrons flowing from the source electrode 48 into the source region 50 in the narrow portion 31 as indicated by the arrow 101 is extremely small. In contrast, since the width of the wide portion 32 is large, the contact area of the source region 50 with the source electrode 48 is large in the wide portion 32. Therefore, the contact resistance of the source region 50 in the wide portion 32 with respect to the source electrode 48 is low. Therefore, many electrons flow into the source region 50 from the source electrode 48 in the wide portion 32 as indicated by the arrow 102. Therefore, the main electron inflow path, when the switching element 10 is turned on, is indicated by the arrow 102. The electrons flowing from the source electrode 48 into the source region 50 in the wide portion 32 as indicated by the arrow 102 pass through the source region 50, move from the wide portion 32 to the narrow portion 31 as indicated by the arrow 103, and flow into the low concentration region 52b (that is, the channel) in the narrow portion 31. Since the mobility of the channel in the narrow portion 31 is high, electrons can pass through the channel with low loss. The electrons having passed through the channel flow to the drain electrode 49 through the drift region 56 and the drain region 58.

As described above, in the switching element 10, since the source region 50 is in contact with the source electrode 48 in the wide portion 32 with a low contact resistance, a loss is less likely to occur when electrons flow into the source region 50 in the wide portion 32. The electrons flowing into the source region 50 in the wide portion 32 flow to the drift region 56 through the channel in the narrow portion 31. Since high mobility is obtained in the channel in the narrow portion 31 due to the narrow channel effect, loss is less likely to occur when electrons pass through the channel. Therefore, the on-resistance of the switching element 10 is extremely low.

Further, since the electrons flow into the drift region 56 from the channel in the narrow portion 31, the electrons flow at a high density in the drift region 56 below the narrow portion 31. On the other hand, almost no electrons flow in the drift region 56 below the wide portion 32. Therefore, current flows in the drift region 56 at a higher density in the lower part of the narrow portion 31 than in the lower part of the wide portion 32. In the switching element 10, as shown in FIG. 4, the narrow portions 31 and the wide portions 32 are alternately arranged in the y direction in each inter-trench region 30. The narrow portions 31 and the wide portions 32 are alternately arranged via the trenches 20 in the x direction. That is, the narrow portions 31 are arranged in a distributed manner in each of the x direction and the y direction. By dispersedly arranging the narrow portions 31 in this manner, current concentration in the drift region 56 can be suppressed. This further reduces the on-resistance of the switching element 10. In addition, since the current flows in the drift region 56 at a higher density in the lower part of the narrow portion 31 than in the lower part of the wide portion 32, the temperature of the narrow portion 31 is likely to be higher than that of the wide portion 32. By dispersedly arranging the narrow portions 31 that are likely to have a high temperature, the occurrence of an extreme temperature gradient in the semiconductor substrate 12 is suppressed. Accordingly, the stress applied to the semiconductor substrate 12 is reduced, and the durability of the switching element 10 can be improved.

In the switching element 10, the source region 50 is in ohmic contact with the source electrode 48 not only in the wide portion 32 but also in the narrow portion 31. Therefore, as indicated by the arrow 101 in FIG. 3, electrons flow into the source region 50 from the source electrode 48 even in the narrow portion 31 although the amount is small. Incoming electrons, as indicated by the arrow 101, also contribute to the current. Therefore, the on-resistance of the switching element 10 is further reduced.

When the switching element 10 is turned off, a depletion layer spreads from the low concentration region 52*b* and the electric field relaxation region 54 into the drift region 56, and an electric field is generated in the depletion layer. At this time, when a high electric field is applied to the gate insulating film 42, the gate insulating film 42 may be broken down. In particular, in the corner portions C1 and C2 at the lower end of the trench 20, a high electric field is likely to be generated, and the gate insulating film 42 is likely to be broken down. According to the present embodiment, since the electric field relaxation region 54 covers the corner portion C1, a high electric field is restricted from being applied to the corner portion C1. The electric field relaxation region 54 extends from the low concentration region 52*b* to the lower side of each trench 20. Therefore, when the drift region 56 is depleted, a potential difference is less likely to occur in the drift region 56 within a range between the electric field relaxation regions 54. Therefore, a high electric field is restricted from being applied to the corner portion C2. In this manner, the electric field applied to the gate insulating film 42 can be reduced by the electric field relaxation region 54.

In a switching element of a comparative example shown in FIG. 12, the regions 200 in which the gate trenches are provided and the regions 300 in which the gate trenches are not provided are alternately arranged along the y direction. Therefore, the gate trenches extending in the y direction are divided by the region 300, and the gate trenches are not connected between the regions 200. Therefore, it is necessary to provide a wiring (so-called gate wiring) for the gate electrode in each of the regions 200. This complicates the gate wiring and increases the area of the surface of the semiconductor substrate occupied by the gate wiring. Therefore, the chip size of the switching element increases. In contrast, in the switching element 10 according to the present embodiment, since the trench 20 (that is, the gate electrode 44) continuously extends in the y direction, the gate wiring can be simplified. Therefore, the area occupied by the gate wiring is small, and the chip size of the switching element 10 can be made smaller than that of the switching element illustrated in FIG. 12.

Figure 5:
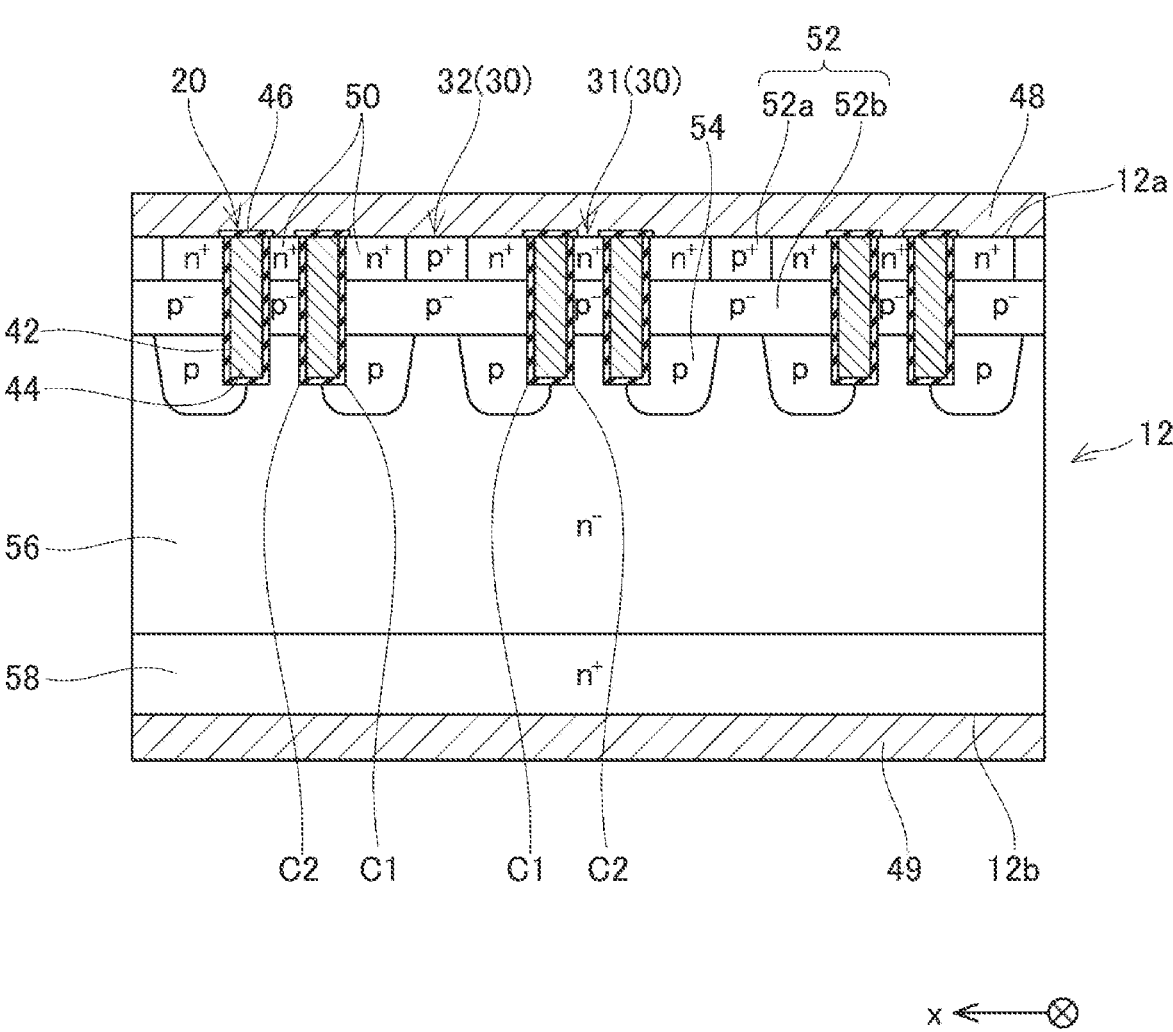
FIG. 5 is a cross-sectional view illustrating a switching element according to a first modification of the first embodiment taken along the x direction.

In the first embodiment, the electric field relaxation region 54 is in contact with the entire lower surface of the low concentration region 52*b*. Alternatively, as shown in FIG. 5, there may be a portion where the electric field relaxation region 54 is not provided below the low concentration region 52*b*. Also in this configuration, since the electric field relaxation region 54 is provided so as to cover the corner portion C1, generation of a high electric field in the corner portions C1 and C2 can be suppressed.

Figure 6:
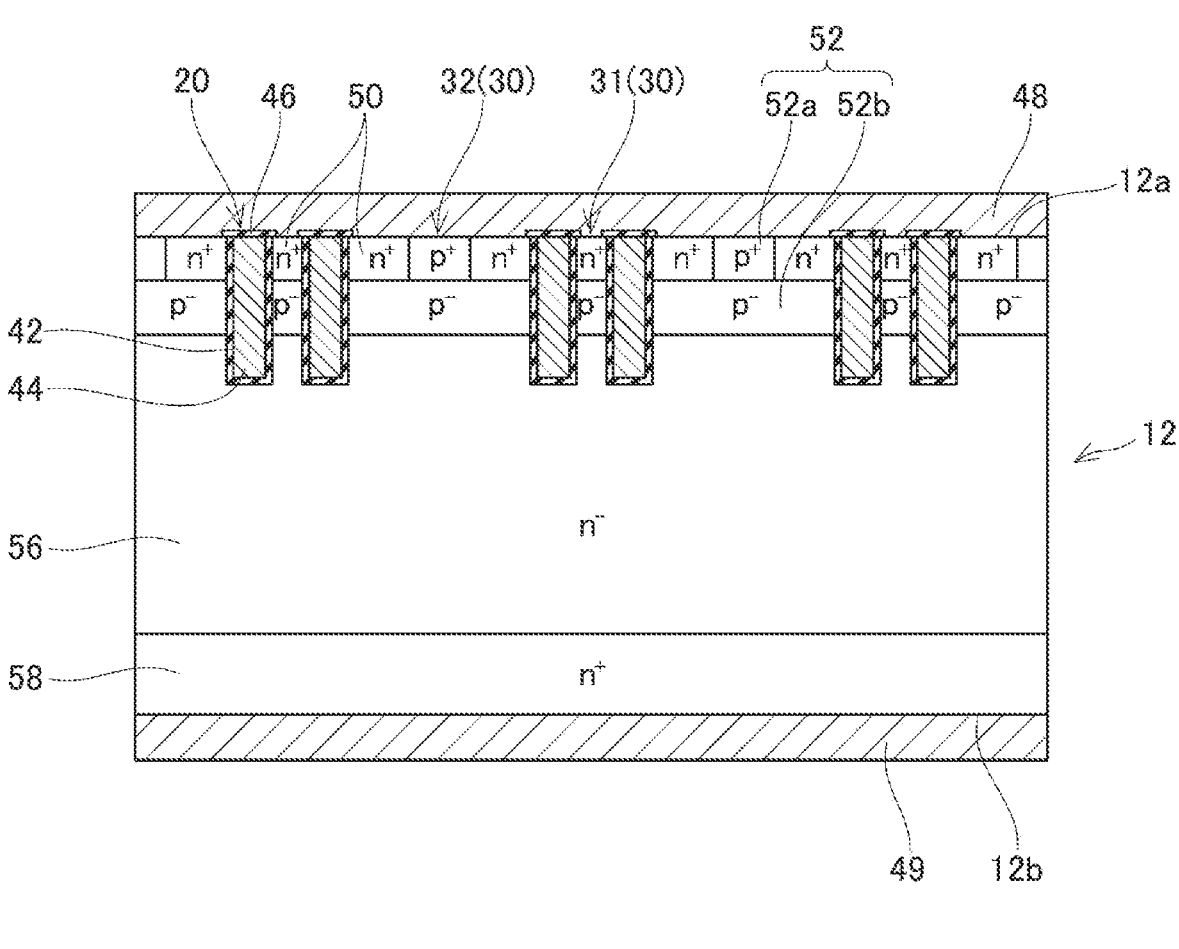
FIG. 6 is a cross-sectional view illustrating a switching element according to a second modification of the first embodiment taken along the x direction.

When the breakdown voltage of the gate insulating film 42 is high, the electric field relaxation region 54 may not be provided as illustrated in FIG. 6. In the configuration of FIG. 6, since the electric field relaxation region 54 does not exist below the low concentration region 52*b* in the wide portion 32, the inversion layer formed in the low concentration region 52*b* in the wide portion 32 functions as a channel. However, since the narrow channel effect does not occur in the channel in the wide portion 32, the mobility of the channel in the wide portion 32 is lower than the mobility of the channel in the narrow portion 31. Therefore, even in this case, the current density in the drift region 56 is higher in the lower part of the narrow portion 31 than in the lower part of the wide portion 32. Therefore, by dispersedly arranging the narrow portions 31 as illustrated in FIG. 4, it is possible to suppress current concentration in the drift region 56.

Second Embodiment

Figure 7:
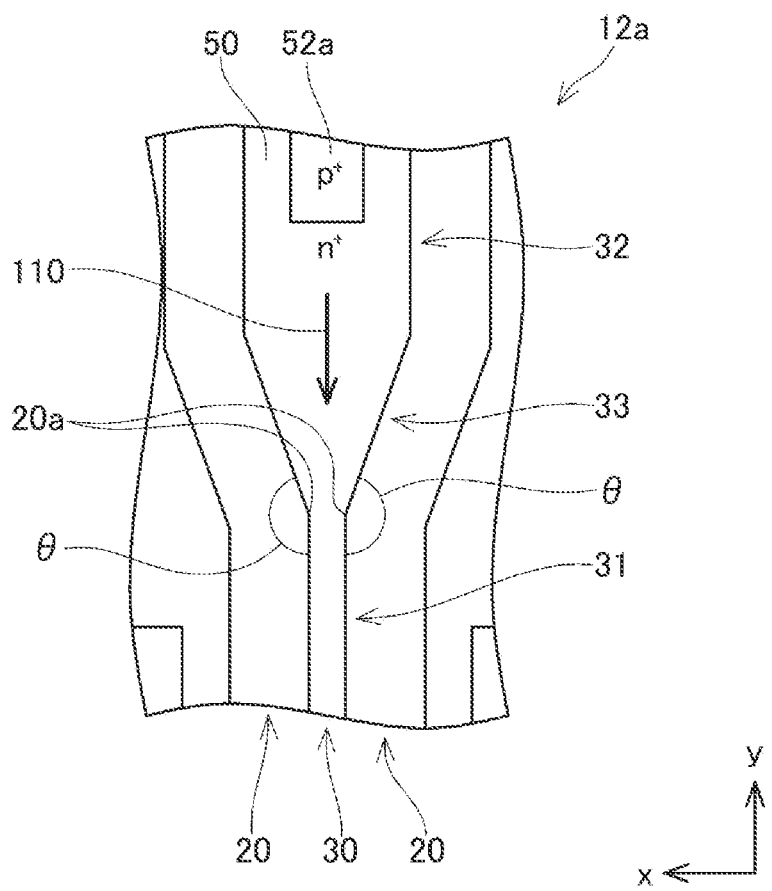
FIG. 7 is a plan view showing arrangement of trenches on the upper surface of a switching element according to a second embodiment.

FIG. 7 shows the upper surface 12*a* of the switching element of the second embodiment. In FIG. 7, illustration of the gate insulating film 42 and the gate electrode 44 in the trench is omitted. FIG. 7 shows an enlarged view of the boundary portion 33 between the narrow portion 31 and the wide portion 32. Except for the boundary portion 33, the switching element of the second embodiment has the same configuration as the switching element 10 of the first embodiment.

As shown in FIG. 7, when viewed from the upper side, the width of the boundary portion 33 in the x direction (that is, the width of the inter-trench region 30 in the x direction) gradually decreases from the wide portion 32 toward the narrow portion 31. Therefore, the angle θ of each bent portion 20*a* of each trench 20 is an obtuse angle.

Also in the second embodiment, similarly to the first embodiment, when the switching element is turned on, electrons flow from the wide portion 32 toward the narrow portion 31 in the source region 50 as indicated by the arrow 110 in FIG. 7. At this time, since the width of the boundary portion 33 is gradually narrowed, the resistance of the boundary portion 33 becomes higher at a position closer to the narrow portion 31 when electrons flow. As described above, the resistance of the boundary portion 33 gradually increases, so that the electric field applied to the gate insulating film 42 at the bent portion 20*a* of each trench 20 can be relaxed. As described above, in the switching element of the second embodiment, the gate insulating film 42 in the vicinity of the boundary portion 33 can be protected from a high electric field.

Third Embodiment

Figure 8:
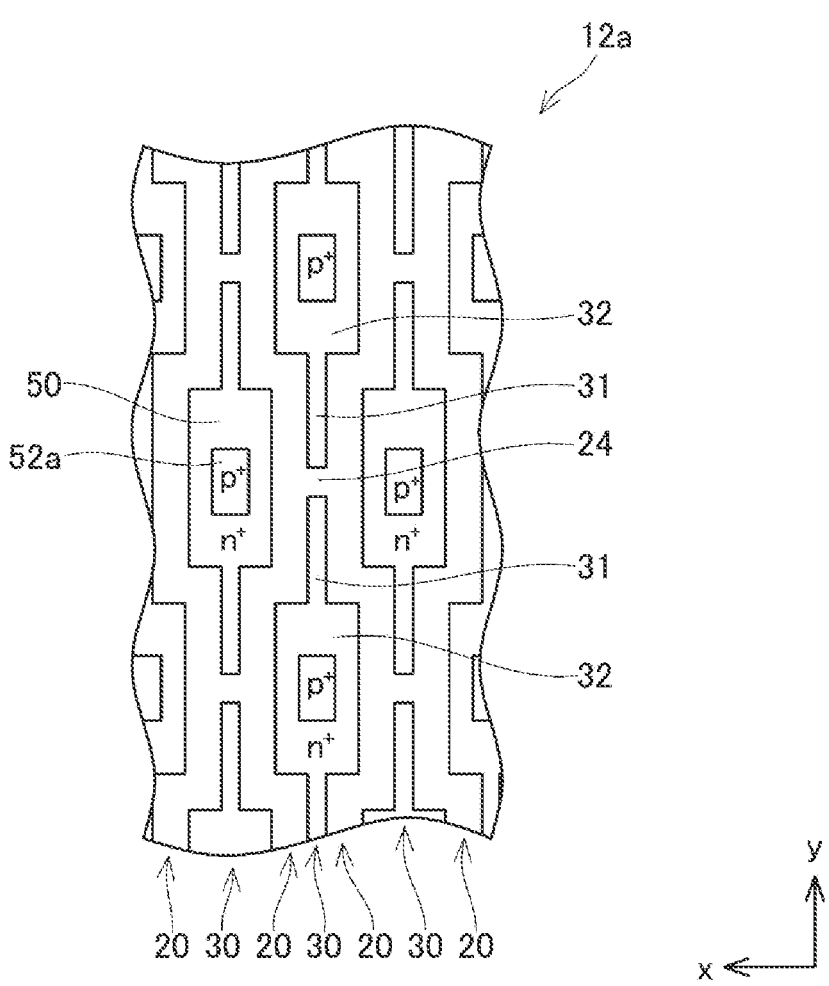
FIG. 8 is a plan view showing arrangement of trenches on the upper surface of a switching element according to a third embodiment.

FIG. 8 shows the upper surface 12*a* of the switching element of the third embodiment. In FIG. 8, illustration of the gate insulating film 42 and the gate electrode 44 in the trench is omitted. As shown in FIG. 8, in the third embodiment, a connection trench 24 is provided on the upper surface 12*a* of the semiconductor substrate 12. Except for the connection trench 24, the switching element of the third embodiment has the same configuration as the switching element 10 of the first embodiment.

As shown in FIG. 8, the connection trench 24 is provided at the center of each narrow portion 31 in the y direction. Each of the connection trenches 24 extends in the x direction and connects the trenches 20 through the narrow portion 31. The gate insulating film 42 and the gate electrode 44 are arranged in the connection trench 24, as in the trench 20. That is, in the connection trench 24, the gate insulating film 42 and the gate electrode 44 are arranged so as to be continuous from the inside of the trench 20. Also in the connection trench 24, the gate electrode 44 is insulated from the semiconductor substrate 12 by the gate insulating film 42.

Figure 9:
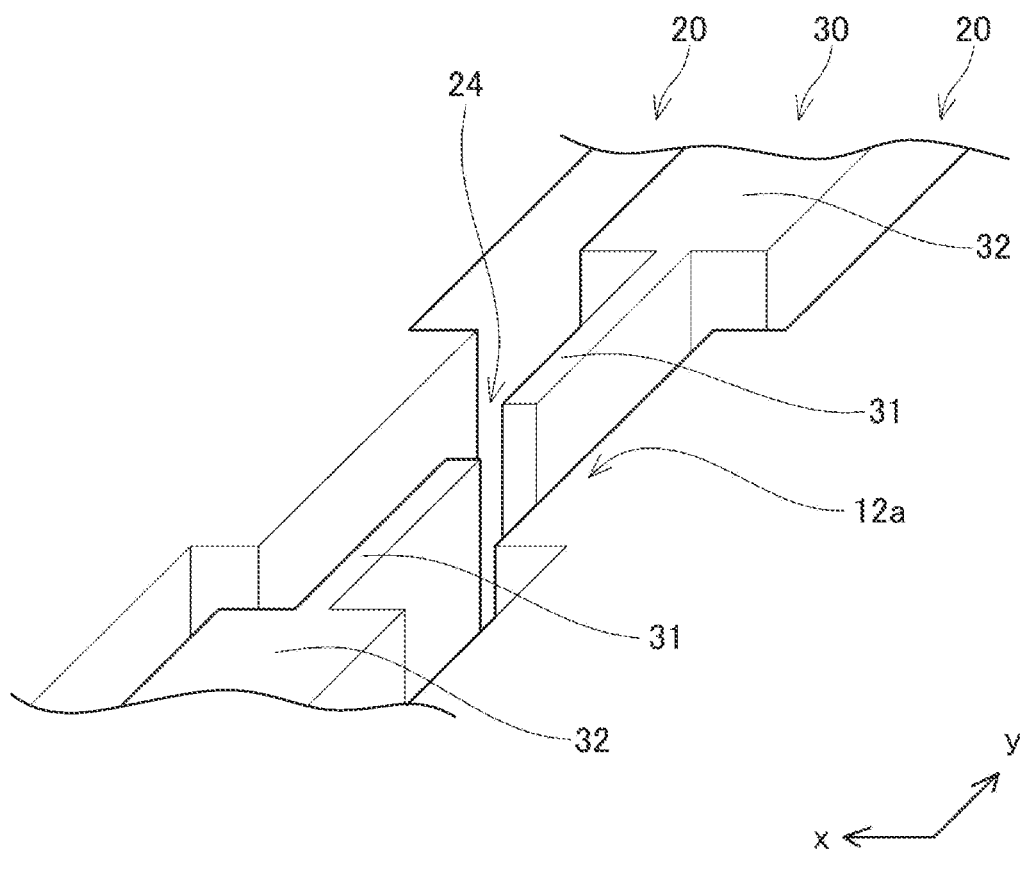
FIG. 9 is an explanatory view of a step of forming a trench in the switching element of the third embodiment.

In the process of manufacturing the switching element, as shown in FIG. 9, the trench 20 is formed on the upper surface 12*a* of the semiconductor substrate 12 by etching. Due to a temperature change or the like in the etching process, stress such as compressive stress or tensile stress is applied to the inter-trench region 30 along the y direction. When the connection trench 24 does not exist, a crack may occur in the semiconductor layer constituting the narrow portion 31 due to stress applied to the narrow portion 31 along the y direction. According to the present embodiment, the connection trench 24 is provided as illustrated in FIG. 9, such that the narrow portion 31 is separated into two parts in the y direction by the connection trench 24. Thus, the stress applied to the narrow portion 31 is significantly reduced. Accordingly, damage to the semiconductor layer constituting the narrow portion 31 is suppressed.

Fourth Embodiment

Figure 10:
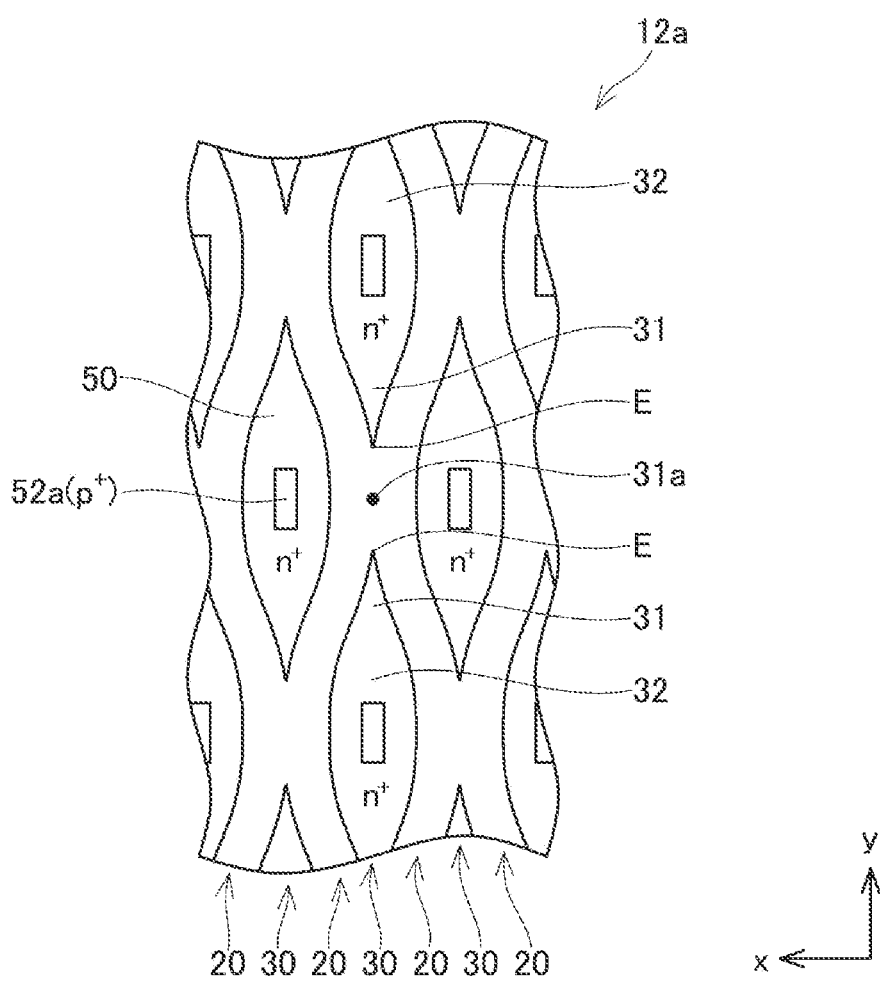
FIG. 10 is a plan view showing arrangement of trenches on the upper surface of a switching element according to a fourth embodiment.
Figure 11:
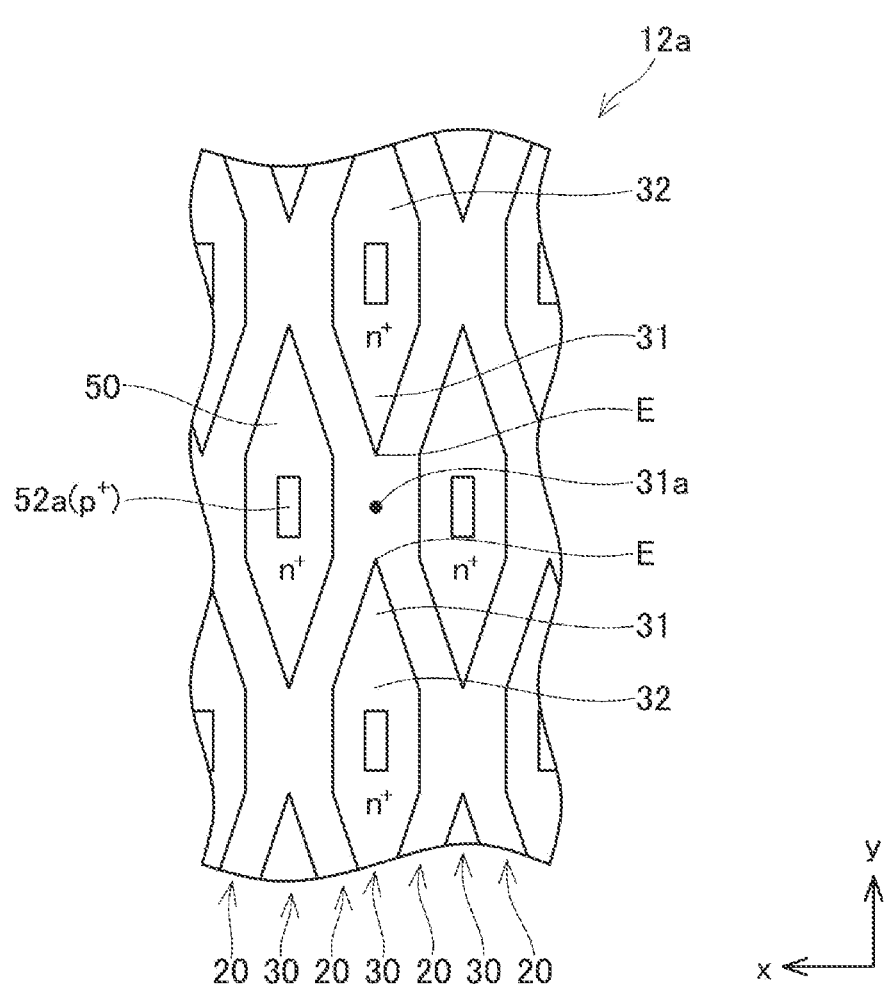
FIG. 11 is a plan view illustrating arrangement of trenches on an upper surface of a switching element according to a modification of the fourth embodiment.

FIG. 10 shows the upper surface 12*a* of the switching element 10 of the fourth embodiment. In FIG. 10 and FIG. 11, illustration of the gate insulating film 42 and the gate electrode 44 in the trench is omitted. In the fourth embodiment, each trench 20 extends along the y direction while meandering in a curved shape. The adjacent trenches 20 are connected to each other at a central part 31*a* of each narrow portion 31 in the y direction. Other configurations of the switching element of the fourth embodiment are the same as those of the switching element 10 of the first embodiment.

As shown in FIG. 10, the width of each narrow portion 31 in the x direction gradually decreases toward the central part 31*a* of the narrow portion 31. In addition, at the central part 31*a* of the narrow portion 31, the trenches 20 are connected to each other through the narrow portion 31. Therefore, at the point E in the vicinity of the central part 31*a*, the narrow portion 31 has the minimum width. Therefore, at the point E, the highest channel mobility is obtained due to the narrow channel effect. Therefore, according to the fourth embodiment, the on-resistance of the switching element can be extremely reduced.

In the fourth embodiment, since the trenches 20 are connected to each other by the central part 31*a* of the narrow portion 31, even if the relative position of the trench 20 in the x direction varies due to a manufacturing error, the point E having the minimum width can be reliably formed in the narrow portion 31. Therefore, it is possible to suppress variation in channel mobility due to variation in the relative position of the trench 20 in the x direction. Therefore, according to the fourth embodiment, it is possible to suppress the manufacturing variation of the channel mobility of the switching element.

In the fourth embodiment, each trench 20 meanders in a curved shape. Alternatively, as shown in FIG. 11, each trench 20 may extend in a polygonal line shape. Also in the configuration of FIG. 11, the point E having the minimum width can be formed in the narrow portion 31.

In the above embodiments, the MOSFET is described as the switching element. However, the technology disclosed in the present specification may be applied to other switching elements such as an insulated gate bipolar transistor (IGBT).

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A switching element comprising:
   a semiconductor substrate;
   a plurality of trenches on an upper surface of the semiconductor substrate;
   a gate insulating film covering an inner surface of each of the trenches;
   a gate electrode disposed in each of the trenches and insulated from the semiconductor substrate by the gate insulating film; and
   a source electrode on the upper surface of the semiconductor substrate, wherein
   the plurality of trenches is arranged on the upper surface such that a longitudinal direction of each of the trenches is defined as a first direction,
   the plurality of trenches is arranged on the upper surface and spaced from each other in a second direction intersecting the first direction,
   each of the trenches extends in the first direction while being displaced in the second direction on the upper surface so as to meet
   a first condition that an inter-trench region which is a semiconductor region defined between the trenches adjacent to each other has a plurality of narrow portions and a plurality of wide portions wider in the second direction than the narrow portion, and
   a second condition that the narrow portions and the wide portions are alternately arranged in the first direction, on the upper surface, and the narrow portions and the wide portions are alternately arranged in the second direction via the trenches,
   the semiconductor substrate includes:
   an n-type source region disposed in the inter-trench region over the narrow portion and the wide portion, in contact with the source electrode in the wide portion, and in contact with the gate insulating film in the narrow portion;

a p-type body region disposed in the inter-trench region and in contact with the gate insulating film on a lower side of the source region in the narrow portion; and an n-type drift region distributed from the narrow portion to a region below the plurality of trenches and in contact with the gate insulating film on a lower side of the body region in the narrow portion.

2. The switching element according to claim 1, wherein the body region is distributed over the narrow portion and the wide portion, and is located below the source region in the wide portion, and the drift region is distributed over a lower part of the wide portion and a lower part of the narrow portion.

3. The switching element according to claim 2, wherein the semiconductor substrate includes a p-type electric field relaxation region in contact with the body region and in contact with the gate insulating film at a corner portion between a side surface of the trench adjacent to the wide portion and a bottom surface of the trench.

4. The switching element according to claim 1, wherein a width of the inter-trench region in the second direction decreases from the wide portion toward the narrow portion at a boundary portion between the narrow portion and the wide portion.

5. The switching element according to claim 1, wherein a connection trench is provided on the upper surface of the semiconductor substrate to connect the trenches through the narrow portion.

6. The switching element according to claim 1, wherein a width of the narrow portion in the second direction decreases from the wide portion toward a central part of the narrow portion, in each of the narrow portions, and the trenches on both sides of the narrow portion are connected to each other at the central part of the narrow portion.

7. The switching element according to claim 1, wherein the source region is in contact with the source electrode in each of the narrow portions.

8. The switching element according to claim 1, wherein the body region is in contact with the source electrode in each of the wide portions.

* * * * *